United States Patent
Schmidt et al.

(10) Patent No.: US 8,545,938 B2
(45) Date of Patent: Oct. 1, 2013

(54) METHOD OF FABRICATING A CERAMIC COMPONENT

(75) Inventors: Wayde R. Schmidt, Pomfret Center, CT (US); David C. Jarmon, Kensington, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 13/251,696

(22) Filed: Oct. 3, 2011

(65) Prior Publication Data

US 2013/0084389 A1 Apr. 4, 2013

(51) Int. Cl.
*C23C 16/22* (2006.01)

(52) U.S. Cl.
USPC .............. 427/248.1; 427/249.2; 427/255.393; 427/255.394; 427/900

(58) Field of Classification Search
USPC .............. 427/249.2, 255.28, 900, 248.1, 249, 427/2, 255.393, 255.394
See application file for complete search history.

(56) References Cited

U.S. PATENT DOCUMENTS

| | | | |
|---|---|---|---|
| 4,738,902 A | 4/1988 | Prewo et al. | |
| 5,304,031 A | 4/1994 | Bose | |
| 5,350,003 A * | 9/1994 | Sonuparlak et al. | 164/91 |
| 5,628,938 A * | 5/1997 | Sangeeta et al. | 264/28 |
| 6,228,453 B1 | 5/2001 | Fareed et al. | |
| 6,696,144 B2 | 2/2004 | Holowczak et al. | |
| 7,749,568 B2 | 7/2010 | Schmidt | |
| 2002/0004450 A1 * | 1/2002 | Gaffney et al. | 502/256 |
| 2003/0111752 A1 * | 6/2003 | Wood et al. | 264/29.1 |
| 2003/0138672 A1 * | 7/2003 | Bauer et al. | 428/698 |
| 2006/0197244 A1 * | 9/2006 | Simpson et al. | 264/29.7 |
| 2008/0020193 A1 | 1/2008 | Jang et al. | |
| 2008/0199681 A1 * | 8/2008 | Murphy | 428/312.8 |
| 2008/0299385 A1 * | 12/2008 | Philippe et al. | 428/336 |
| 2009/0214781 A1 * | 8/2009 | La Forest et al. | 427/249.2 |
| 2011/0033263 A1 * | 2/2011 | Matsubayashi | 411/366.1 |
| 2011/0071013 A1 * | 3/2011 | Newton et al. | 501/95.2 |
| 2011/0071014 A1 * | 3/2011 | Kmetz et al. | 501/95.2 |
| 2011/0268577 A1 * | 11/2011 | Bouillon et al. | 416/241 B |

OTHER PUBLICATIONS

Grujicic, M., et al., "Non-isothermal preform infiltration during the vacuum-assisted resin transfer molding (VARTM) process." Applied Surface Science 245 (2005) 51-64.*
Kang, M.K., et al., "Analysis of vacuum bag resin transfer molding process". Composites: Part A 32 (2001) 1553-1560.*

* cited by examiner

*Primary Examiner* — Bret Chen
(74) *Attorney, Agent, or Firm* — Carlson, Gaskey & Olds, P.C.

(57) ABSTRACT

A method of fabricating a ceramic component includes using vapor infiltration to deposit a ceramic coating within pores of a porous structure to form a preform body with residual interconnected porosity. Transfer molding is then used to deposit a heated, liquid glass or glass/ceramic material into the residual interconnected porosity. The liquid ceramic or ceramic/glass material is then solidified to form a ceramic component.

23 Claims, 1 Drawing Sheet

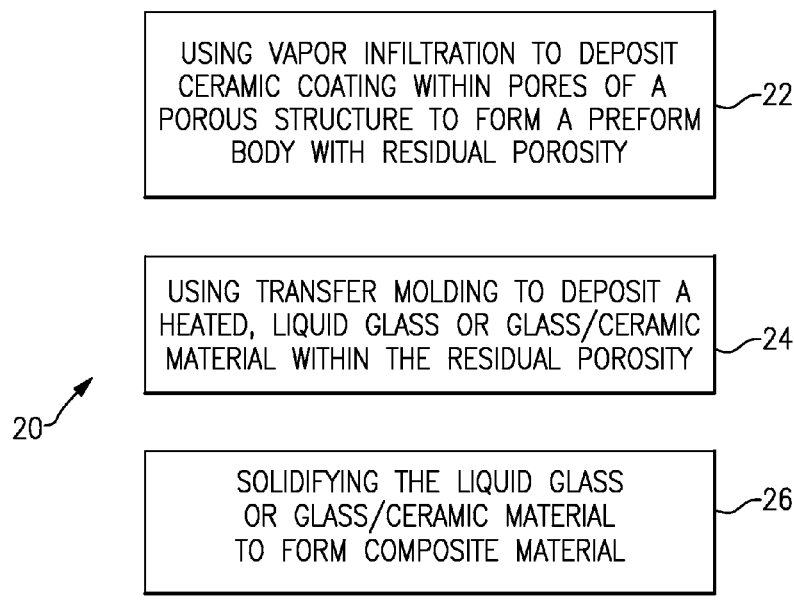
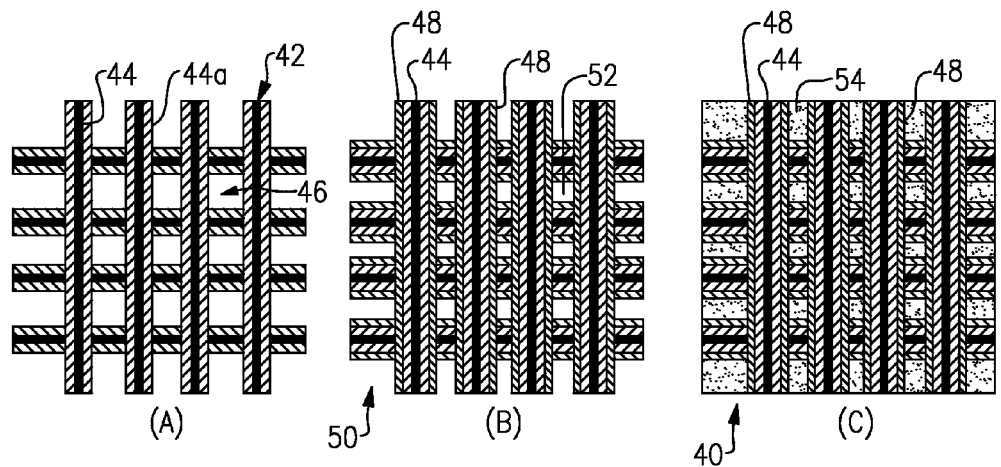

METHOD OF FABRICATING A CERAMIC COMPONENT

BACKGROUND

This disclosure relates to ceramic materials. Ceramic materials are known and used for components such as coatings, ceramic bodies and ceramic matrices. For example, ceramic materials are fabricated using techniques such as polymer impregnation and pyrolysis, melt infiltration, slurry infiltration, slip casting, tape casting, injection molding, dry pressing, isostatic pressing, hot isostatic pressing and others. The selected processing technique controls the chemistry and microstructure of the ceramic material and thus can also limit the chemistry and microstructure.

SUMMARY

Disclosed is a method of fabricating a ceramic component. An example includes using vapor infiltration to deposit a ceramic coating within pores of a porous structure to form a preform body with residual interconnected porosity. Transfer molding is then used to deposit a heated, liquid glass or glass/ceramic material into the residual porosity. The liquid glass or glass/ceramic material is then solidified to form a ceramic component.

In another aspect, a method of fabricating a ceramic component includes using vapor infiltration to deposit a coating having a first coefficient of thermal conductivity within pores within a porous fibrous structure to form a preform body with residual interconnected porosity. The porous fibrous structure includes fibers that are coated with a protective coating. A heated, liquid glass or glass/ceramic material is then deposited within the residual porosity of the preformed body using transfer molding. The liquid glass or glass/ceramic material is then cooled to form a solid glass or glass/ceramic material that has a second coefficient of thermal conductivity that is lower than the first coefficient of thermal conductivity of the coating.

Also disclosed is a ceramic component that includes a porous fibrous structure that has fibers that are coated with a protective coating. A ceramic coating is located on the protective coating within pores of the porous fibrous structure. The ceramic coating and porous fibrous structure define a residual interconnected porosity. A solid glass or glass/ceramic material is within the residual interconnected porosity.

BRIEF DESCRIPTION OF THE DRAWINGS

The various features and advantages of the disclosed examples will become apparent to those skilled in the art from the following detailed description. The drawings that accompany the detailed description can be briefly described as follows.

FIG. 1 illustrates an example method of fabricating a ceramic component.

FIG. 2 illustrates various stages through fabrication of a ceramic component.

DETAILED DESCRIPTION OF THE PREFERRED EMBODIMENT

FIG. 1 illustrates an example method 20 of fabricating a ceramic component. As will be appreciated, the method 20 permits fabrication of ceramic components having unique compositions and/or microstructures that are not heretofore available. Furthermore, the method 20 can be used to produce compositions and/or microstructures for the enhancement of densification, thermal conductivity or other target property in components such as cooled turbine engine components.

As illustrated in FIG. 1, the method 20 generally includes a vapor infiltration step 22, a transfer molding step 24 and a solidification step 26.

As shown, in step 22 a ceramic coating is deposited using vapor infiltration within pores of a porous structure to form a preform body with residual interconnected porosity. As an example, the vapor infiltration includes chemical vapor infiltration (CVI) in which one or more volatile ceramic precursors penetrate into the porous structure and react to deposit the ceramic material within the porous structure. The deposited ceramic material is a result of chemical reaction of the ceramic precursor(s) occurring at the internal surfaces of the porous structure. The infiltration of the precursor(s) is driven by diffusion, an imposed external gas pressure, an imposed vacuum or a combination of these. In one non-limiting example based on silicon carbide, the precursor is methyltrichlorosilane mixed in a hydrogen carrier gas. The methyltrichlorosilane decomposes to silicon carbide. In general, the temperature, time, precursor(s), carrier gas(es), pressure and flow rate(s) are selected to control the composition and amount of the resulting ceramic coating that is deposited.

The vapor infiltration step 22 is controlled such that the resulting residual porosity of the preform body is within a predefined range. In one example, the predefined range is 40-80 volume percent of the preform body. If the ceramic coating reduces the residual porosity to less than about 40 volume percent, the interconnectivity of residual porosity is reduced such that the liquid glass material is unable to later substantially fully infiltrate the porosity to form a near fully dense component.

In the transfer molding step 24, a heated, liquid glass or glass/ceramic material is deposited within the residual porosity of the preform body using transfer molding. The liquid glass or glass/ceramic material is then cooled at step 26 to increase viscosity and thereby immobilize the glass or glass/ceramic material as a solid to form a ceramic material that includes the solid glass or glass/ceramic material, the ceramic coating and the porous structure. As an example, the preform body is subjected to a ceramic glass-transfer molding process in which the body is located in a suitable molding tool. Molten glass or glass/ceramic of the selected composition is injected into the tool cavity to infiltrate the residual porosity of the preform body. The body is cooled to solidify the glass or glass/ceramic into a solid glass or glass/ceramic material. Optionally, a thermal heat treatment is conducted after solidification to induce selective crystallization of ceramic phase(s) within the glass or glass/ceramic. An example temperature range for the heat treatment is from about 1000° C. to about 1500° C. for times ranging from about 10 minutes to about 4 hours.

As used herein, the term "ceramic" refers to inorganic, non-metallic materials that may be crystalline, partially crystalline or substantially or fully amorphous, and including allotropes of carbon, such as graphite and diamond. Further, the term "glass" as used herein, refers to an amorphous or partially amorphous ceramic material. In one embodiment, the ceramic coating is different from the glass or glass/ceramic material in at least one of composition, microstructure and physical property. In a further embodiment, the ceramic coating is a crystalline ceramic material and the glass or glass/ceramic material is partially or fully amorphous.

The chemical composition of the ceramic coating, porous structure and glass or glass/ceramic material can be tailored to control the desired properties of the final ceramic component that is formed by method 20. In one example, the method 20 is used to enhance thermal conductivity of the composite material. For instance, the ceramic coating that is deposited into the pores of the porous structure has a first thermal conductivity and the glass or glass/ceramic material has a second thermal conductivity that is lower than the first coefficient of thermal conductivity. Thus, the ceramic coating acts as a thermal transfer network in the ceramic component while the glass or glass/ceramic material enhances other properties, such as thermal resistance, dimensional stability and corrosion resistance.

In a further embodiment, the ceramic coating is a non-oxide ceramic material. In a further example, the ceramic coating is selected from silicon carbide, aluminum nitride, boron nitride, boron phosphide, silicon nitride, beryllium oxide, diamond or other solid with high thermal conductivity or combinations thereof.

In a further embodiment, the porous structure is a porous fibrous structure. For example, the porous fibrous structure is a fabric, weave, tape, braid, two-dimensional, or three-dimensional structure that is coated or uncoated with a protective coating. In one example, the porous fibrous structure includes ceramic fibers and/or carbon fibers. The ceramic fibers include oxide or non-oxide ceramic fibers. In a further example, the ceramic fibers are silicon carbide fibers. In other examples, the fibers are silicon oxycarbide, silicon oxycarbide with refractory metal dopants such as Ti, B, Zr, or Hf and/or glass or glass/ceramic fibers. It is to be understood that the porous structure may alternatively be another kind of porous structure that may or may not include fibers.

In a further embodiment, the porous fibrous structure includes a protective coating on the fibers. The protective coating includes an oxide layer, a non-oxide layer or both and can be a monolayer coating or a multilayer coating. For instance, the protective coating includes one or more layers of carbon, boron nitride, boron carbide, silicon nitride, silicon carbide and aluminosilicate including combinations of these, including alternating layers of different compositions.

In a further embodiment, the ceramic glass is a silicate-based glass or glass/ceramic. For example, the silicate-based glass or glass/ceramic includes boron, barium, magnesium, lithium, aluminum or combinations thereof. In a further example, the silicate-based glass or glass/ceramic additionally includes a nucleating agent that serves to precipitate crystalline phases from the amorphous phase with the application of thermal treatment. In one non-limiting example, the nucleating agent includes zirconium.

In a further embodiment, the selected glass or glass/ceramic material additionally includes a solid filler to modify the properties of the ceramic component. In one example, the solid filler is a solid ceramic filler, such as silicon carbide. In other examples, the solid filler is a silicon-containing filler, such as oxides, nitrides, borides, carbides and combinations thereof that include silicon.

In a further embodiment, the chemical compositions of the ceramic coating, porous structure and glass or glass/ceramic material are selected to enhance the transfer molding step 24. For example, the compositions of the ceramic coating and the glass or glass/ceramic material disclosed herein are compatible such that the glass or glass/ceramic material in the liquid state wets the ceramic coating to aid in substantially fully filling the residual interconnected porosity during the transfer molding step 24. The compatibility between the ceramic coating and the glass or glass/ceramic material reduces the molding pressure needed in the transfer molding step 24 and thus enhances filling of the pores and process efficiency and repeatability. Furthermore, the composition, temperature and/or pressure can be adjusted to change the viscosity of the glass or glass/ceramic material to enhance the filling of the pores. In one example, the residual porosity in the preform body is 40-80 volume percent and the liquid ceramic glass material is molded at a viscosity of about 5-15 Pa·s and a molding pressure of about 0.5-1.5 ksi (3.4-10.3 megapascals) to produce a residual void volume of less than one volume percent in the final ceramic component. In a further example of the compatibility, the chemical composition of the ceramic coating includes, as a constituent element, at least one element in common with the chemical composition of the glass or glass/ceramic material.

FIG. 2 illustrates three different stages (A), (B) and (C) in a fabrication of a final ceramic component 40 according to the method 20. It is to be understood that the method 20 is not limited to fabrication of the exemplary ceramic component 40. As shown in initial stage (A), a porous fibrous structure 42 includes a plurality of fibers 44 that define open pores 46 there between. In this example, each of the fibers 44 includes a protective coating 44a of composition described herein disposed on the outer surfaces of the fibers 44.

The fibers 44 in this example are transversely oriented to each other such that there is a first layer of parallel fibers and an adjacent second layer of parallel fibers that are orientated at approximately 90 degrees to the fibers of the first layer. Given this description, one of ordinary skill in the art will recognize other fiber orientations and arrangements to meet their particular needs.

Referring to stage (B), a ceramic coating 48 is deposited into the pores 46 of the porous fibrous structure 42 to form a preform body 50 with residual interconnected porosity 52.

At stage (C), the liquid glass or glass/ceramic material is transfer-molded into the residual interconnected porosity 52 of the preform body 50. Upon solidification, solid glass or glass/ceramic material 54 substantially fills the residual interconnected porosity 52. The ceramic component 40 is thus formed of the solid glass or glass/ceramic material 54, the ceramic coating 48 and the porous fibrous structure 42.

In the illustrated example, the ceramic component 40 fabricated according to method 20 includes a final composition, by volume percentage, of:

20-70 of the fibers 44, up to 5 of the protective coating 44a on the fibers 44, 5-20 of the ceramic coating 48, and a remainder of the solid glass or glass/ceramic material 54 and residual void volume, wherein the residual void volume is less than 1 volume percent. It is to be understood that the volume percentages of the constituents in the final composition must total 100%.

In a further example, the final composition from above includes:

30-60 of the fibers 44, 1-2 of the protective coating 44a on the fibers 44, and 20-40 of the solid glass or glass/ceramic material 54.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure.

The scope of legal protection given to this disclosure can only be determined by studying the following claims.

What is claimed is:

1. A method of fabricating a ceramic component, the method comprising:
    using vapor infiltration to deposit a ceramic coating within pores of a porous structure to form a preform body with residual interconnected porosity;
    using transfer molding to deposit a heated, liquid glass or liquid glass/ceramic material within the residual interconnected porosity of the preform body; and
    solidifying the liquid glass or liquid glass/ceramic material by cooling the heated, liquid glass or liquid glass/ceramic material to increase viscosity and form a ceramic component including solid glass or glass/ceramic material, the ceramic coating and the porous structure.

2. The method as recited in claim 1, wherein the residual porosity is 40-80 volume percent of the preform body.

3. The method as recited in claim 1, wherein the ceramic coating has a first coefficient of thermal conductivity, and the solid glass or glass/ceramic material has a second coefficient of thermal conductivity that is less than the first coefficient of thermal conductivity.

4. The method as recited in claim 1, wherein the ceramic coating is selected from a group consisting of silicon carbide, aluminum nitride, boron nitride, boron phosphide, silicon nitride, beryllium oxide, diamond and combinations thereof, and the solid glass or glass/ceramic material comprises a silicate-based glass.

5. The method as recited in claim 4, wherein the silicate-based glass comprises an element selected from a group consisting of boron, barium, magnesium, lithium, aluminum and combinations thereof.

6. The method as recited in claim 5, wherein the silicate-based glass includes a nucleating agent.

7. The method as recited in claim 1, wherein the liquid glass or liquid glass/ceramic material includes a solid ceramic filler.

8. The method as recited in claim 7, wherein the solid ceramic filler includes a silicon-containing material.

9. The method as recited in claim 1, wherein the residual porosity is 40-80 volume percent of the preform body, and including transfer molding the liquid glass or liquid glass/ceramic material at a viscosity of about 5-15 Pa·s and a molding pressure of about 0.5-1.5 ksi (3.4-10.3 megapascals) or less to produce a residual void volume of less than one volume percent in the ceramic component.

10. The method as recited in claim 1, including conducting a heat treatment to produce ceramic phases from in the glass or glass/ceramic material.

11. The method as recited in claim 1, wherein the solid glass or glass/ceramic material comprises a silicate-based glass including an element selected from the group consisting of boron, barium, magnesium, lithium, aluminum and combinations thereof, the silicate-based glass including a nucleating agent of zirconium.

12. The method as recited in claim 1, including, after the solidifying of the liquid glass or glass/ceramic material, thermally treating the ceramic component and inducing selective crystallization of a ceramic phase within the glass or glass/ceramic.

13. The method as recited in claim 1, wherein the porous structure includes ceramic fibers.

14. The method as recited in claim 13, wherein the ceramic fibers include oxide fibers.

15. The method as recited in claim 13, wherein the ceramic fibers include non-oxide fibers.

16. The method as recited in claim 13, wherein the ceramic fibers are silicon carbide fibers.

17. The method as recited in claim 13, wherein the ceramic fibers are silicon oxycarbide fibers.

18. The method as recited in claim 13, wherein the ceramic fibers are silicon carbide fibers with a refractory metal dopant selected from a group consisting of titanium, boron, zirconium and hafnium.

19. A method of fabricating a ceramic component, the method comprising:
    using vapor infiltration to deposit a ceramic coating having a first coefficient of thermal conductivity within pores of a porous fibrous structure to form a preform body with residual interconnected porosity, the porous fibrous structure including, prior to the vapor infiltration, fibers that are coated with a protective coating;
    using transfer molding to deposit a heated, liquid glass or glass/ceramic material within the residual interconnected porosity of the preform body; and
    cooling the liquid glass or glass/ceramic material to form a solid glass or glass/ceramic material having a second coefficient of thermal conductivity that is lower than the first coefficient of thermal conductivity of the coating, to form a ceramic component including the solid glass or glass/ceramic material, the ceramic coating and the porous fibrous structure.

20. The method as recited in claim 19, wherein the residual porosity is 40-80 volume percent.

21. The method as recited in claim 19, wherein the protective coating is selected from a group consisting of carbon, boron nitride, boron carbide, silicon nitride, silicon carbide, aluminosilicate and combinations thereof, and the coating as selected from a group consisting of silicon carbide, aluminum nitride, boron nitride, boron phosphide, silicon nitride, beryllium oxide, diamond and combinations thereof.

22. The method as recited in claim 19, wherein the ceramic component has a final composition, by volume percentage, of:
    20-70 of the fibers,
    up to 5 of the protective coating on the fibers,
    5-20 of the ceramic coating, and
    a remainder of the solid glass or glass/ceramic material and residual void volume, wherein the residual void volume is less than 1 volume percent.

23. The method as recited in claim 22, wherein the final composition includes:
    30-60 of the fibers,
    1-2 of the protective coating on the fibers, and
    20-40 of the solid glass or glass/ceramic material.

* * * * *